United States Patent
Huai et al.

(10) Patent No.: US 9,025,371 B1
(45) Date of Patent: May 5, 2015

(54) SPIN-TRANSFER TORQUE MAGNETIC RANDOM ACCESS MEMORY (STTMRAM) WITH PERPENDICULAR LAMINATED FREE LAYER

(71) Applicant: Avalanche Technology, Inc., Fremont, CA (US)

(72) Inventors: Yiming Huai, Pleasanton, CA (US); Rajiv Yadav Ranjan, San Jose, CA (US); Roger K. Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/611,125

(22) Filed: Jan. 30, 2015

Related U.S. Application Data (63) Continuation of application No. 13/685,650, filed on Nov. 26, 2012, now Pat. No. 8,982,616, which is a continuation of application No. 12/779,881, filed on May 13, 2010, now Pat. No. 8,374,025, and a (Continued)

(51) Int. Cl.
*G11C 11/14* (2006.01)
*H01L 43/10* (2006.01)
*H01L 43/08* (2006.01)
*H01L 43/02* (2006.01)

(52) U.S. Cl.
CPC ............... *H01L 43/10* (2013.01); *H01L 43/08* (2013.01); *H01L 43/02* (2013.01); *Y10S 977/933* (2013.01); *Y10S 977/935* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/295, 421, E21.665; 438/3; 428/810–816, 817–825.1, 826; 977/933–935
See application file for complete search history.

(56) References Cited

U.S. PATENT DOCUMENTS

| | | | | |
|---|---|---|---|---|
| 6,303,218 | B1 * | 10/2001 | Kamiguchi et al. | 428/332 |
| 6,495,275 | B2 * | 12/2002 | Kamiguchi et al. | 360/324.11 |
| 2002/0009616 | A1 * | 1/2002 | Kamiguchi et al. | 428/692 |
| 2004/0170055 | A1 * | 9/2004 | Albert et al. | 365/173 |
| 2007/0063237 | A1 * | 3/2007 | Huai et al. | 257/295 |

*Primary Examiner* — Harry W Byrne
(74) *Attorney, Agent, or Firm* — Bing K. Yen (57) ABSTRACT

A perpendicular spin-transfer torque magnetic random access memory (STTMRAM) element includes a fixed layer having a magnetization that is substantially fixed in one direction and a barrier layer formed on top of the fixed layer and a free layer. The free layer has a number of alternating laminates, each laminate being made of a magnetic layer and an insulating layer. The magnetic layer is switchable and formed on top of the barrier layer. The free layer is capable of switching its magnetization to a parallel or an anti-parallel state relative to the magnetization of the fixed layer during a write operation when bidirectional electric current is applied across the STT-MRAM element. Magnetic layers of the laminates are ferromagnetically coupled to switch together as a single domain during the write operation and the magnetization of the fixed and free layers and the magnetic layers of the laminates have perpendicular anisotropy.

15 Claims, 8 Drawing Sheets

Related U.S. Application Data continuation-in-part of application No. 11/674,124, filed on Feb. 12, 2007, now Pat. No. 8,084,835, and a continuation-in-part of application No. 11/739,648, filed on Apr. 24, 2007, now Pat. No. 8,183,652, and a continuation-in-part of application No. 11/776,692, filed on Jul. 12, 2007, now Pat. No. 8,063,459, which is a continuation-in-part of application No. 11/740,861, filed on Apr. 26, 2007, now abandoned, and a continuation-in-part of application No. 11/678,515, filed on Feb. 23, 2007, now Pat. No. 8,058,696, and a continuation-in-part of application No. 11/739,648, filed on Apr. 24, 2007, now Pat. No. 8,183,652, and a continuation-in-part of application No. 11/674,124, filed on Feb. 12, 2007, now Pat. No. 8,084,835, said application No. 11/739,648 is a continuation-in-part of application No. 11/678,515, filed on Feb. 23, 2007, now Pat. No. 8,058,696, and a continuation-in-part of application No. 11/674,124, filed on Feb. 12, 2007, now Pat. No. 8,084,835.

(60) Provisional application No. 61/178,918, filed on May 15, 2009, provisional application No. 60/853,115, filed on Oct. 20, 2006.

Table 1: CoFeB/MgO Magnetic-insulator laminated films

|    | number of laminates | Laminate structure         | Ms(emu/cc) | Hk (Oe) |
|----|---------------------|----------------------------|------------|---------|
| C1 | 2 laminates         | 1nm CoFeB/0.1nm MgO        | 1150       | 50      |
| C2 | 3 laminates         | 0.7nm CoFeB/0.1nm MgO      | 1090       | 50      |
| C3 | 4 laminates         | 0.7nm CoFeB/0.1nm MgO      | 1050       | 50      |
| C4 | 4 laminates         | 0.6nm CoFeB/0.1nm MgO      | 1030       | 50      |
| C5 | 4 laminates         | 0.5nm CoFeB/0.1nm MgO      | 980        | 32      |
| C6 | 4 laminates         | 0.5nm CoFeB/0.1nm MgO      | 1010       | 30      |
| C7 | 4 laminates         | 0.5nm CoFeB/0.12nm MgO     | 770        | 20      |
| C8 | 4 laminates         | 0.5nm CoFeB/0.2nm MgO      | 730        | 5       |

FIG. 6

Table 2: FeSiOx/MgO Magnetic-insulator laminated films

| | number of laminates | Laminate structure | Ms(emu/cc) |
|---|---|---|---|
| F1 | 1 laminate | 2nm FeSiOx/0.2nm MgO | 1230 |
| F2 | 2 laminates | 2nm FeSiOx/0.2nm MgO | 1230 |
| F3 | 3 laminates | 0.7nm FeSiOx/0.2nm MgO | 740 |
| F4 | 4 laminates | 0.7nm FeSiOx/0.2nm MgO | 760 |
| F5 | 4 laminates | 0.6nm FeSiOx/0.2nm MgO | 610 |
| F6 | 4 laminates | 0.5nm FeSiOx/0.2nm MgO | 330 |
| F7 | 4 laminates | 0.7nm FeSiOx/0.3nm MgO | 360 |

FIG. 7

Table 3: STTMRAM element having Composite Laminated Free Layer

| | Composite Laminated Free-layer structure | TMR | RA(ohm-um²) |
|---|---|---|---|
| L1 | 4x(0.5nm CoFeB/0.15nm MgO) | 89.5 | 23.7 |
| L2 | 0.7nm CoFeB/3x(0.2nm MgO/0.5 nm CoFeB)/0.2MgO/1.0nm CFB | 106.1 | 18.5 |
| L3 | 1.0 nm CoFeB/3X(0.5nm FeSiOx/0.2 MgO) | 107.8 | 13.3 |
| L4 | 1.0 nm CoFeB/0.2nm MgO/0.5nm FeSiOx | 94.9 | 15.8 |

FIG. 8

SPIN-TRANSFER TORQUE MAGNETIC RANDOM ACCESS MEMORY (STTMRAM) WITH PERPENDICULAR LAMINATED FREE LAYER

CROSS REFERENCE TO RELATED APPLICATIONS

The present application is a continuation of U.S. application Ser. No. 13/685,650, entitled "A Spin-Transfer Torque Magnetic Random Access Memory (STTMRAM) With Laminated Free Layer," filed on Nov. 26, 2012, which is a continuation of U.S. application Ser. No. 12/779,881, entitled "A Spin-Transfer Torque Magnetic Random Access Memory (STTMRAM) With Laminated Free Layer", filed on May 13, 2010, which claims priority to a previously-filed U.S. Provisional Application No. 61/178,918 entitled "A Spin-Transfer Torque Magnetic Random Access Memory (STTMRAM) With Laminated Free Layer", filed on May 15, 2009 and is a continuation-in-part of U.S. patent application Ser. No. 11/674,124, filed Feb. 12, 2007 by Ranjan, et al., entitled "Non-Uniform Switching Based Non-Volatile Magnetic Based Memory", which claims priority to U.S. Provisional Application No. 60/853,115 entitled "Non-Uniform Switching Based Non-Volatile Magnetic Base Memory", filed on Oct. 20, 2006 and is a continuation-in-part of U.S. patent application Ser. No. 11/739,648, filed Apr. 24, 2007 by Ranjan, et al., entitled "Non-Volatile Magnetic Memory With Low Switching Current and High Thermal Stability", which is a continuation-in-part of U.S. patent application Ser. No. 11/674,124 entitled "Non-uniform Switching Based Non-Volatile Magnetic Base Memory", filed on Feb. 12, 2007 and a continuation-in-part of U.S. patent application Ser. No. 11/678,515 entitled "A High Capacity Low Cost Multi-State Magnetic Memory", filed on Feb. 23, 2007 and is a continuation-in-part of U.S. patent application Ser. No. 11/776,692, filed Jul. 12, 2007 by Ranjan entitled "Non-Volatile Magnetic Memory Element with Graded Layer", which is a continuation-in-part of U.S. patent application Ser. No. 11/740,861, entitled "A High Capacity Low Cost Multi-Stacked Cross Line Magnetic Memory", filed on Apr. 26, 2007, which is a continuation-in-part of U.S. patent application Ser. No. 11/739,648 entitled "Non-Volatile Magnetic Memory With Low Switching Current And High Thermal Stability", filed on Apr. 24, 2007, which is a continuation-in-part of U.S. patent application Ser. No. 11/678,515 entitled "A High Capacity Low Cost Multi-State Magnetic Memory", filed on Feb. 23, 2007, which is a continuation-in-part of U.S. patent application Ser. No. 11/674,124 entitled "Non-uniform Switching Based Non-Volatile Magnetic Base Memory", filed on Feb. 12, 2007, the disclosures of which are incorporated herein by reference, as though set forth in full.

BACKGROUND OF THE INVENTION

1. Field of the Invention

The present invention relates to a spin-transfer torque magnetic random access memory (STTMRAM), and, more particularly, to an STTMRAM element having a free layer with a laminated structure of magnetic and non-magnetic layers.

2. Description of the Prior Art

Spin transfer torque magnetic random access memory (STTMRAM) is one of the next generations of non-volatile memory currently under development. In STTMRAM, writing magnetic bits is achieved by using a spin polarized current through the magnetic tunnel junction (MTJ), instead of using a magnetic field. The STTMRAM write current scales down with smaller MTJ size in future technology nodes. STTMRAM has significant advantages over magnetic-field-switched (toggle) MRAM, which has been recently commercialized. One of the main drawbacks associated with field switched MRAM is its more complex cell architecture, which utilizes bypass line and remote write lines in one transistor and one MTJ design. Additional drawback includes its high write current (currently in the order of milli Amps (mA)) and poor scalability, which is currently limited to about 65 nano meters (nm). In addition, the field required to switch the bit, i.e. the current required to write the bits, increases rapidly as the size of the MTJ elements shrinks. On the other hand, the STTMRAM, which utilizes the spin transfer torque (STT) writing technology by directly passing a current through the MTJ, overcomes these hurdles with much lower switching current (in the order of micro A). This results in a simpler cell architecture that can be as small as $6F^2$ (for single-bit cells) and reduced manufacturing cost, and more importantly, improved scalability.

The STTMRAM memory for high-density and high-speed memory applications requires substantial reduction of the intrinsic current density to switch the magnetization of the free layer while maintaining high thermal stability, which is required for long-term data retention. Low switching (write) current is required mainly for reducing the size of the select transistor of the memory cell, which is typically coupled in series with MTJ to achieve smaller memory cell size and thus the highest possible memory density. The program or write current for a given transistor is proportional to the channel width (in unit of F) of the transistor. Thus, an STTMRAM with lower switching current requires smaller transistor and hence smaller cell size. In addition, a smaller voltage-drop across MTJ is required during programming as it decreases the probability of tunneling barrier degradation and breakdown, ensuring better write endurance for the device. This is particularly important for STTMRAM, because both read and write currents are driven through MTJ cells.

Thus, there is a need for an STTMRAM with low intrinsic current and rapid switching and small cell size.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on spin current-induced-magnetization-switching having reduced switching current in the magnetic memory.

Briefly, an embodiment and method of the present invention includes a spin-transfer torque magnetic random access memory (STTMRAM) element, which includes a fixed layer having a magnetization that is substantially fixed in one direction and a barrier layer formed on top of the fixed layer and a free layer. The free layer has a number of alternating laminates, each laminate being made of a magnetic layer and an insulating layer. The magnetic layer is switchable and formed on top of the barrier layer. The free layer is capable of switching its magnetization to a parallel or an anti-parallel state relative to the magnetization of the fixed layer during a write operation when bidirectional electric current is applied across the STTMRAM element. Magnetic layers of the laminates are ferromagnetically coupled to switch together as a single domain during the write operation and the magnetization of the fixed and free layers and the magnetic layers of the laminates have either in-plane or perpendicular anisotropy.

These and other objects and advantages of the present invention will no doubt become apparent to those skilled in the art after having read the following detailed description of the preferred embodiments illustrated in the several figures of the drawing.

What is needed is an STTMRAM element with lower programming current density and higher thermal stability than that experienced by prior art STTMRAM.

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a spin-transfer torque magnetic random access memory (STTMRAM) refers to a memory array composed of memory cells including select transistors. The MRAM may include core and peripheral circuits, row and column decoders, sense amplifiers and the like.

STTMRAM element includes a magnetic tunnel junction (MTJ) having a fixed layer and a composite laminated free layer wherein the composite laminate free layer is comprised of alternate magnetic layers and insulating layers, and can include additional layers such as bottom and top electrodes which are required to integrate with the access transistor for forming the STTMRAM. The magnetic layer is single ferromagnetic material or alloy in one embodiment of the present invention and it can be ferrimagnetic materials or an alloy. Selection of the magnetic materials and insulating materials and their individual thicknesses for use in the free layer, as disclosed herein, advantageously reduces the switching current density and increases reliability in single domain switching through reduction in saturation magnetization and reduction in damping constant of the free layer. In an exemplary embodiment, the switching current density is less than 1 mega ampere per centimeter squared ($MA/cm^2$) while maintaining high thermal stability. Thermal stability is commonly defined by KuV/kT where Ku represents magnetic anisotropy constant, V represents the volume of the free layer, k is Boltzmann's constant and T represents temperature. In an exemplary embodiment, high thermal stability is greater than 50.

Figure 1:
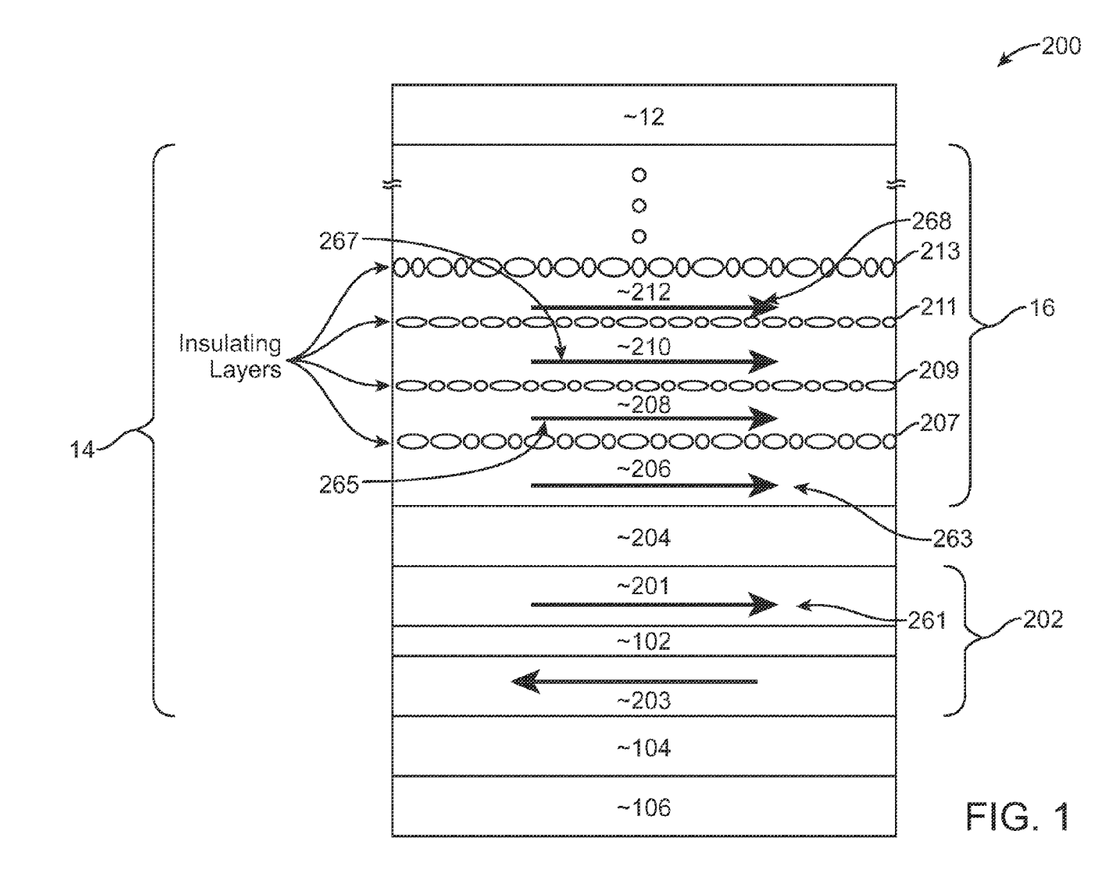
FIG. 1 shows an STTMRAM element 200, in accordance with an embodiment of the present invention.

Referring now to FIG. 1, a spin-transfer torque magnetic random access memory (STTMRAM) element 200 is shown in accordance with an embodiment of the present invention. Relevant layers of the STTMRAM element 200 are shown to comprise of a magnetic tunnel junction (MTJ) 14 made of fixed layer 202, barrier layer 204, and composite laminated free layer 16. It is understood and well known that fixed layer 202 is typically formed on top of an anti-ferromagnetic (AF) layer which is formed on top of an underlayer 106. The fixed layer 202 is comprised of two ferromagnetic layers 201 and 203 having anti-parallel magnetization orientation due to the RKKY coupling through the AF coupling layer 102, which separates the two ferromagnetic layers. Such fixed layer is commonly referred to as "synthetic AF" layer. Cap layer 12 is shown formed on top of the free layer 16. The fixed layer 202 is shown formed on top of the AF layer 104 which is shown formed on top of an underlayer 106 that is generally formed on top of a substrate.

In one embodiment of the present invention, free layer 16 is comprised of magnetic layers 206 on top of which is formed insulating layer 207 on top of which is formed magnetic layer 208 on top of which is formed insulating layer 209 on top of which is formed magnetic layer 210 on top of which is formed insulating layer 211 on top of which is formed magnetic layer 212 on top of which is formed insulating layer 213 on top of the free layer 16 is shown formed cap layer 12. It is understood that while free layer 16 is shown, in the embodiment of FIG. 1, to include four magnetic layers and four insulating layers, however, in other embodiments, a greater or lesser number of such layers may comprise free layer 16.

As shown in FIG. 1, the magnetic layers and the insulating layers of free layer 16 alternate such that an insulating layer is formed on top of a magnetic layer and a magnetic layer is formed on top of an insulating layer. This alternating formation is referred to herein as "laminate". The magnetic layer of free layer 16 may be a single ferromagnetic material or alloy in one embodiment of the present invention and can be a ferrimagnetic material or alloy.

While in the embodiment of FIG. 1, magnetic layer 206 forms the first layer of free layer 16 and is formed on top of barrier layer 204, in other embodiments, an insulating layer rather than a magnetic layer may be the first layer of free layer 16. In those embodiments, the first insulating layer is typically a part of barrier layer 204 and a magnetic layer is formed on top of the first insulating layer and the alternating layer continues as such.

The embodiment of FIG. 1 advantageously reduces programming current density and increases tunnel magnetoresistance (TMR). The programming current density is reduced due to lowering of the damping constant through reduction in the spin-pumping to the adjacent layers. In that, the insulating layers of the laminates act as spin conservation layer (opposite of spin pumping). In addition, high TMR is achieved as there are available density-of-states deep into the free layer from the interface barrier layer 204. $TMR=(R_h-R_l/R_l$ where $R_l$ refers to the resistance of magnetic tunnel junction 14 when the magnetic orientations of the fixed layer 261 and the free layer 263 are parallel leading to a parallel-state, and $R_h$ refers to the resistance when these orientations are anti-parallel to each other in an anti-parallel state.

A magnetic layer and an insulating layer of free layer 16 is referred to as one alternating layer of which n may be used in free layer 16 with 'n' being an integer. 'n' is at least 2 and two or more alternating layers may comprise free layer 16. A free layer having 'n' being between 3-5 typically experiences a reduction in programming current density (and switching current) and an increase in TMR. It is noted that reduction of programming current density and TMR increase is related, at least in part, to the number of alternating layers forming free layer 16. Similarly, the thickness of each of the magnetic and insulating layers of the alternating layers affects the reduction of programming current density and the increase of TMR.

The thickness of magnetic layer 206 is sufficiently large enough to prevent insulating layer 207 from contacting barrier layer 204. In one embodiment the thickness of magnetic layer 206 is greater than 0.4 nm. In this respect, in some embodiments, the thickness of magnetic layer 206 is greater than all other remaining magnetic layers and insulating layers of free layer 16. In some embodiments, the thickness of all magnetic layers and all insulating layers of free layer 16 are substantially the same. In still other embodiments, the thickness of each of the magnetic layers of free layer 16 increases with each layer. In other embodiments, the thickness of each of the magnetic layers of free layer 16 decreases with each layer. In still other embodiments, the thickness of each of the insulating layers of free layer 16 increases with each layer. In other embodiments, the thickness of each of the insulating layers of free layer 16 decreases with each layer. In still another embodiment, the thickness of insulating layer 211 is sufficiently large to reduce dynamic damping. In fact, both intrinsic and dynamic damping are reduced as a result. In one embodiment, the thickness of insulating layer 211 is greater than 0.2 nm.

It should be noted that magnetic layers 206, 208, 210 and 212 of free layer 16 have their magnetization directions as shown by arrows 263, 265, 267, 268, respectively, pointed in the same direction indicating that these layers are ferromagnetically coupled together through the discontinuous insulating layers. Thus, during the writing process all the magnetization orientations (or directions), as indicated by arrows 263, 265, 267 and 268 rotate together to the low-resistance, $R_l$, (parallel-state) or the high-resistance, $R_h$, anti-parallel state.

In some embodiments, an insulating layer (not shown) is formed on top of free layer 16. During manufacturing, as will be discussed in further detail below, a sequential sputtering method, known to those in the art, is used to form free layer 16 by alternating one target and another target, each target being either the magnetic layer or the insulating layer and applying power to each target independently so that the amount of material used to form the magnetic layer on the wafer and the amount of material used to form the insulating layer on the wafer can be precisely controlled. It has been experienced that an 'n' of 3-5 yields a desirable combination of minimizing the switching current density while maximizing TMR. Free layer 16 being too thick by many number of 'n's is not desirable because low switching current and high enough TMR is not achieved. The thickness of each layer and n are optimized for high TMR (high TMR is experienced due to the desirable crystalline structure) and low switching current. It has been experienced that a thickness of 2 to 5 nm is an optimal thickness of free layer 16 or n of 3 to 5. Additionally, with a lower number of 'n's, manufacturing is made simpler and therefore more cost effective.

In FIG. 1, the fixed layer 202 is shown formed on top of the anti-ferromagnetic (AF) layer 104, which is shown formed on top of the underlayer 106, which is typically formed on top of a substrate. The underlayers 104 and 106 are non-magnetic and are used to facilitate better crystal growth of the layer 203, as well as to ensure proper compatibility with the underlying substrate. A typical choice of material for each of these layers is one or more of the following material: Ta, Cr, Ti, TaN, TiN, W, Cu and alloys of Ni—Cr, Ni—Cu. In one embodiment, the layer 104 is 5 nm Ta and the layer 106 is 5 nm of TaN.

During operation, bidirectional electric current is applied from below the underlayer 106 or from above cap layer 12. In either manner, (bidirectional electrical) current flows through STTMRAM element 200 and causes the direction of magnetization of free layer 16 to change relative to fixed layer 202. That is, the direction of magnetization (or state) of free layer 16 is either parallel relative to fixed layer 202 or anti-parallel relative to fixed layer 202 and in this manner, STTMRAM element 200 is programmed to be either a binary '1' or '0' or vice versa.

As previously noted, a magnetic layer in combination with an adjacent insulating layer is referred to as laminate. Thus, the STTMRAM element 200 is comprised of 'n' number of laminates, where 'n' is typically between 3 to 5 in some embodiments of the present invention. A free layer having the laminates of the various embodiments of the present invention experiences a lower saturation magnetization (Ms) as well as a lower damping constant than one without the laminates. Since the switching current density is directly proportional to $Ms^2$ and the damping constant, a, the resulting STTMRAM element 200 experiences a lower value than an STTMRAM without the laminates. In addition, the presence of the insulating layers in the composite laminate free layer enables a more effective spin transfer of the torque from the polarized conduction electrons to the spins of the free layer due to specular scattering of the polarized conduction electrons at the ferromagnetic and insulating interface, leading to a lower switching current density. It is noted that free layer 16 is sometimes referred to herein as composite laminate free layer 16. Similarly, laminate free layers of other embodiments shown and described herein are sometimes referred to as composite laminate free layer.

In one embodiment, fixed layer 202 is a synthetic-fixed layer comprised of cobalt iron/ruthenium/cobalt iron boron (CoFe/Ru/CoFeB) alloy. In one embodiment, the magnetic layers of composite laminated free layer 16, namely the layers 206, 208 and 210 are each made of cobalt-iron-boron (CoFeB) and the insulating layers 207, 209, 211 and 213 illustrated in FIG. 1 are each made of magnesium oxide (MgO). In some embodiments, the magnetic layer 206 can be chosen from an alloy of $Co_xFe_{(1-x)}B_z$ where x is greater than 10 atomic percent and z is greater than 12 at. %. The subsequent magnetic layers 208 and 210 can either be made of material analogous to that of magnetic layer 206 or can be chosen from one or more of CoFeY, nickel iron (NiFeY) and CoFeNiY where Y is chosen from one or more of boron (B), phosphorus (P), carbon (C), nitrogen (N), chromium (Cr), tantalum (Ta), titanium (Ti), niobium (Nb), zirconium (Zr), tungsten (W), silicon (Si), copper (Cu), rhodium (Rh), and hafnium (Hf). In alternative embodiments, CoFe-based alloys are employed, such as but not limited to cobalt iron tantalum (CoFeTa), cobalt iron zirconium (CoFeZr) and cobalt iron hafnium (CoFeHf).

In some embodiments, the insulating layer is comprised one or more of the oxides or nitrides from aluminum oxide $(Al_2O_3)$, titanium oxide $(TiO_2)$, tantalum oxide $(Ta_2O_5)$, hafnium oxide $(HfO_2)$, zirconium oxide $(ZrO_2)$, tungsten oxide (WO), niobium oxide $(Nb_2O_5)$, chromium oxide $(Cr_2O_3)$, silicon oxide $(SiO_2)$, yttrium oxide $(Y_2O_3)$, vanadium oxide $(VO_2)$, ruthenium oxide (RuO), strontium oxide (SrO), zinc oxide (ZnO), magnesium oxide (MgO), titanium nitride (TiN), tantalum nitride (TaN), aluminum nitride (AlN), silicon nitride (SiN).

In some embodiments, the thickness of the magnetic layer 206 is typically greater than 0.4 nano meters (nm) while the thickness of each of the magnetic layers 206, 208, 210, 212 is between 0.2 to 1.5 nano meter (nm). The typical thickness of each of the insulating layers 207, 209, 211, 213 is between 0.1 to 1.0 nm. It should be noted that the magnetic layers and the insulating layers of free layer 16 (likely grow as discontinuous film layers as indicated by the varying thickness in the figures) are chosen such that the magnetic layers of free layer 16 are ferromagnetically coupled and switch together as a single domain during the magnetization reversal to "parallel" (low resistance: $R_l$) and "anti-parallel" (high resistance: $R_h$) states at programming or writing. The number of laminates of magnetic and insulating layers can be 2 through 10.

Barrier layer 204, which is also commonly referred to as tunneling barrier layer is typically much thicker than the thickness of each of the insulating layers in the free layer and in an exemplary embodiment is 0.5-2.0 nm (nano-meter) and can be chosen from one or more of magnesium oxide (MgO), ruthenium oxide (RuO), strontium oxide (SrO), zinc oxide (ZnO), aluminum oxide (AlO), titanium oxide ($TiO_2$). From materials point of view, the tunneling barrier layer and the insulating layer can be the same or different oxides or nitrides.

Figure 2:
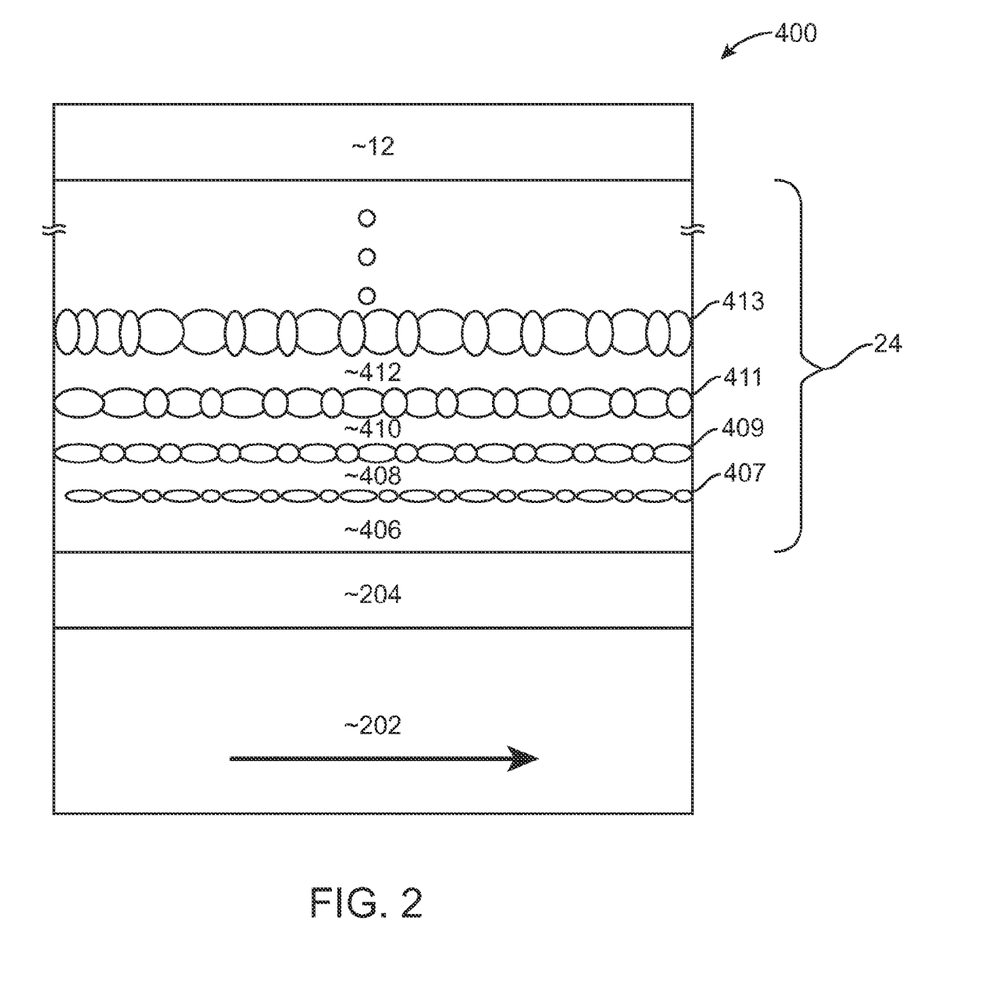
FIG. 2 shows an STTMRAM element 400, in accordance with an embodiment of the present invention.

It should be noted that the individual thicknesses of the magnetic layers, number of laminates and their positions can be varied as shown in FIG. 2. In the embodiment shown in FIG. 2, the STTMRAM element 400 comprises of a composite laminated free layer 24, which has a varying thickness of the insulating layers. It is understood that free layer 24, barrier 204 and fixed layer 202, analogously to FIG. 1, comprise MTJ. This is the case for all embodiments shown herein in that the free layer, barrier layer and fixed layer in FIGS. 1-5 comprise an MTJ. Further, while the cap layer and other layers, such as an underlayer and layers that may be interposed in between the layers, are not shown, nevertheless, these layers are typically employed.

In an exemplary embodiment, the thickness of the insulating layer 407 is between 0.05 and 0.2 nm, the insulating layer 409 is 0.1 to 0.3 nm in thickness and the insulating layer 411 is 0.2 to 0.4 nm in thickness and the insulating layer 413 is 0.4 to 1.5 nm in thickness. Thus, the thickness of the insulating layers 407, 409, 411 and 413 increases from the layer 407 to the layer 413. In an exemplary embodiment, magnetic layers 406, 408, 410 and 412 are typically between 0.2 and 1.0 nm although the thickness of layer 406, which is adjacent to the barrier layer, is typically between 0.5 and 1.5 nm in order to enhance spin polarization effect and to ensure a lower resistance-area (RA) product. The critical switching voltage, Vc, is related to the product of switching current density, Jc, and the resistance-area product, RA. As mentioned above, a lower Vc is required to ensure smaller cell size of the STMTRAM for low cost, high density memory products. If a thinner magnetic layer 406 is employed then the barrier layer 204 thickness and process is optimized to ensure high Tunnel Magnetoresistance (TMR) at low resistance area product (RA).

Additionally, the magnetic layers 206 and 406 in one embodiment of the present invention can be comprised of one or more layers of magnetic alloys in a manner described U.S. patent Ser. No. 11/776,692, filed on Jul. 12, 2007 and published as Patent Publication No. US2008/0191295, Aug. 14, 2008 by Ranjan et al., entitled, "Non-Volatile Magnetic Memory Element With Graded Layer".

Figure 3:
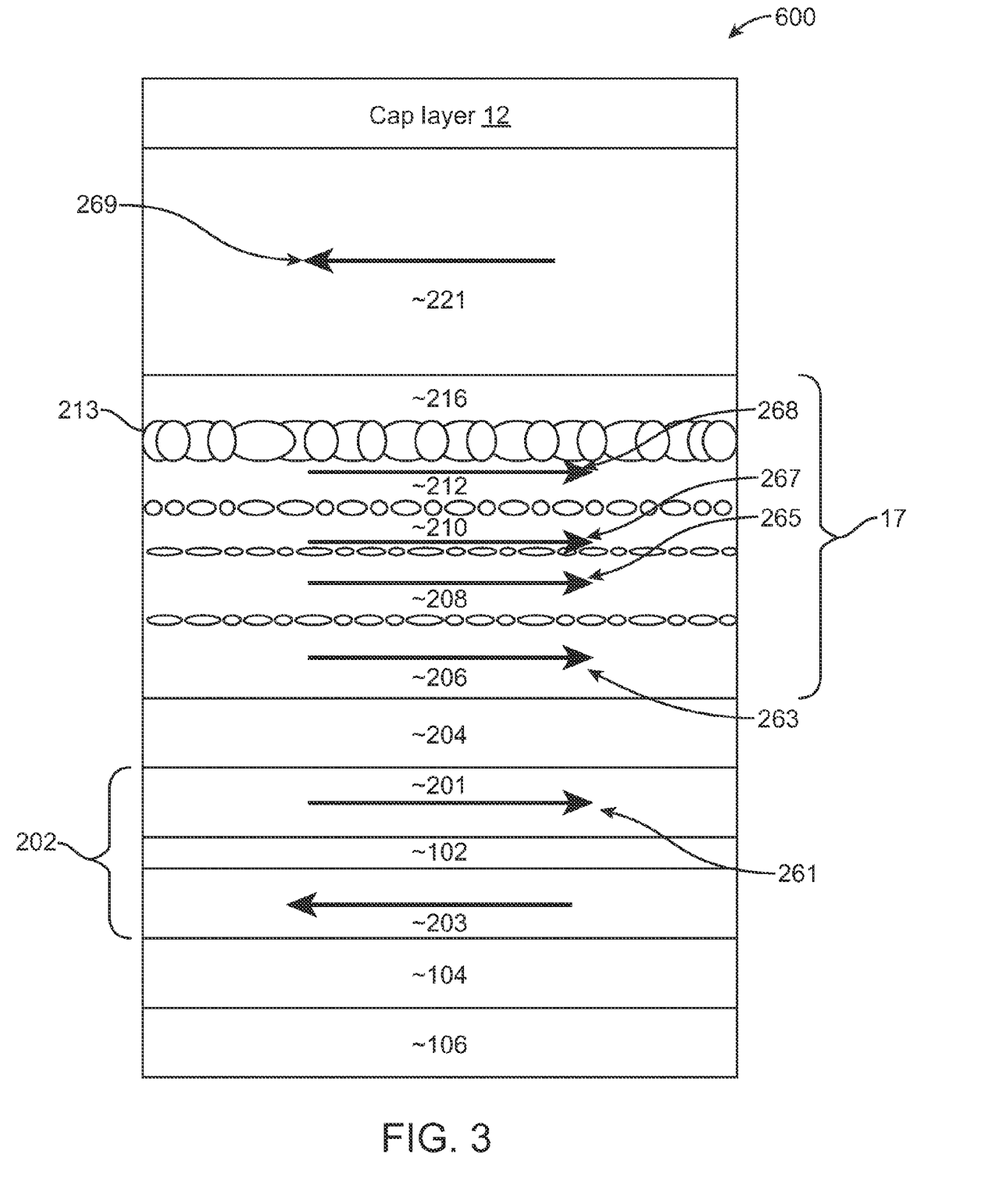
FIG. 3 shows an STTMRAM element 600, in accordance with another embodiment of the present invention.

In the embodiment of FIG. 3, the STTMRAM element 600 comprises a synthetic composite laminated free layer 17 comprised of nonmagnetic layer 216, which is placed between the insulating layer 213 and the magnetic layer 221 to break the direct exchange coupling between the two magnetic layers 212 and 221 through the pin-holes. The "pin-holes" refer to open areas located between the adjacent layers when the film layers become too thin, such as few atomic layers, as is known in the art.

The layer 213 also breaks the direct exchange coupling between the magnetic layer 221 and the magnetic layer 210 as do each of the layers 208 and 206. The STTMRAM element 600 is analogous to the element 200 of FIG. 1 except that the former comprises the nonmagnetic layer 216, which is a part of the free layer 17 and formed on top of the insulating layer of the laminate that is farthest from the fixed layer 202 and on top of the nonmagnetic layer 216 is formed the magnetic layer 221.

In the embodiment of FIG. 3, the net effect is that the magnetization orientation of the magnetic layer 221 of the patterned devices is oriented in the opposite direction to that of the magnetic layer 212 (as indicated be the arrows 268 and 269) due to the dipolar magnetic field.

Thus, the magnetization of the last magnetic layer 221 is magnetostatically coupled to the underlying magnetic layers 212, 210, 208 and 206 and oppositely oriented in the patterned devices due to the dipolar magnetic field. The magnetic layers 212, 210, 208 and 206 are ferromagnetically exchange coupled to each other through the pin-holes in the adjacent insulating layers as shown by the magnetization orientation arrows 263, 265, 267 and 268. In contrast, the magnetization orientation arrow 269 of the magnetic layer 221 of the patterned device is oriented in the opposite direction to the direction of the arrows 263, 265, 267 and 268, which are the direction of magnetization of magnetic layers 206, 208, 210 and 212, respectively. The non-magnetic layer 216 can be selected from an element or an alloy of two or more of the following: titanium (Ti), niobium (Nb), ruthenium (Ru), copper (Cu), aluminum (Al), nickel (Ni), chromium (Cr), molybdenum (Mo), tungsten (W), iridium (Ir), tantalum (Ta), rhodium (Rh), gallium (Ga), germanium (Ge), silicon (Si), and is typically 0.2 to 4 nm thick. The magnetic layer 221 is made of CoFe alloy having less than 20 atomic percent of one or more of boron (B), cooper (Cu), chromium (Cr), tantalum (Ta), tungsten (W), niobium (Nb), silicon (Si), zirconium (Zr), yttrium (Y), gallium (Ga), germanium (Ge), nickel (Ni), molybdenum (Mo), nitrogen (N), carbon (C), and has a thickness of 0.2 nm to 10 nm. The magnetic layers 206-212 are similar to the ones described in FIG. 1.

Figure 4:
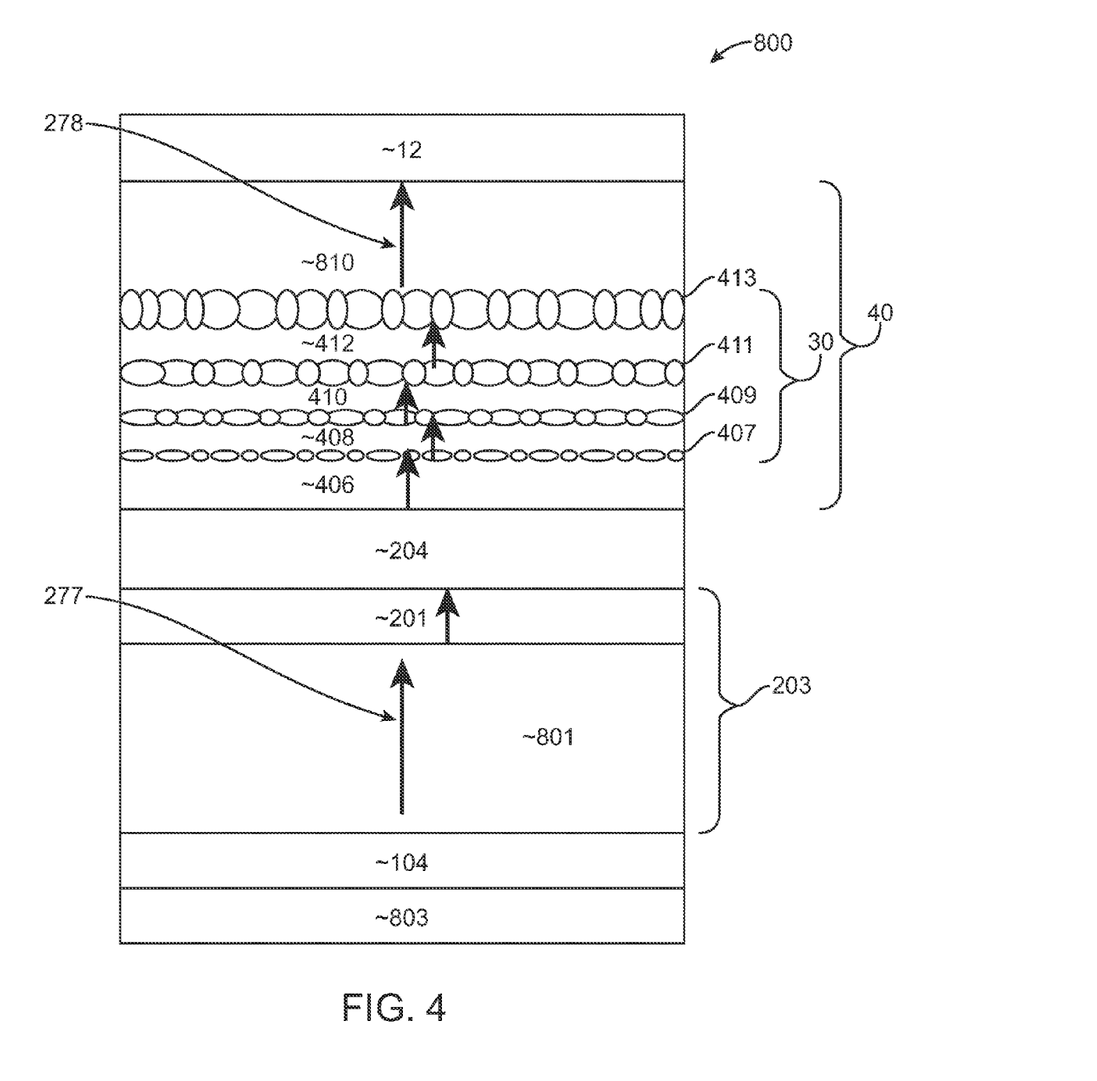
FIG. 4 shows an STTMRAM element 800, in accordance with another embodiment of the present invention.

In the embodiment of FIG. 4, the perpendicular STTM-RAM element 800 comprises a largely perpendicular free layer 40 comprised of laminates of magnetic and insulating layers 30 on top of which is formed the perpendicular magnetic layer 810. It should be noted that the fixed layer 203 is comprised of magnetic layer 801 and magnetic layer 201. In the perpendicular configuration of FIG. 4, the free layer 40 has a magnetic orientation that is either parallel or anti-parallel relative to that of the fixed layer 203 but the magnetic orientations of these layers are perpendicular to the substrate (or film plane), as shown by the arrows 277 and 278.

The fixed layer 203 is shown formed on top of the underlayer 104, which is shown formed on top of the seedlayer 803.

The magnetization orientation of the layer 801 and the magnetic layer 201 is perpendicular as denoted by the magnetization vector 277. It should be pointed out while the magnetic layer 201 is similar to that described in FIG. 1 having an in-plane magnetic anisotropy and may stay in-plane when deposited by itself, the strong perpendicular anisotropy of the perpendicular magnetic layer 801 makes it to be oriented perpendicular to the film plane due to direct magnetic coupling, as shown by the magnetization orientation vector.

Likewise the composite laminated free layer 40 is comprised of laminates of magnetic layers 406, 408, 410, 412 and insulating layers 407, 409, 411, 413. Once again the magnetic layer 406 is similar to the layers 206 in FIG. 1, and the magnetic layers 408, 410, 412 are similar to the magnetic layers 208, 210, 212 of FIG. 1 and can also be similar to the layer 406. Like the layer 406, while the magnetization of the magnetic layers of the laminates may stay in-plane like in FIG. 1 if grown without the perpendicular magnetic layer 810, they become perpendicularly oriented to the film plane as shown by the magnetization vector due to the strong perpendicular anisotropy of the layer 810 and direct magnetic coupling with the layer 810 as pointed by magnetization orientation vector 278.

The magnetic/insulating laminated layer plays a number of key roles, namely, from a crystal growth point of view it acts as a nucleation layer to ensure a perpendicular orientation of the magnetic layer 810 resulting in a perpendicular anisotropy, as pointed by the magnetic orientation vector 278. It is well known to people familiar with this art that growing perpendicular film is challenging especially if the film thickness is smaller such as below 10 nm, as a thinner free layer is required for STTMRAM to ensure low switching current.

In one embodiment of the present invention, the insulating layers 407, 409, 411, 413 are each made of MgO while the 406, 408, 410, 412 are each made of CoFeB, as described earlier. In an embodiment of the present invention, the magnetic layer 406 is comprised of CoFeB and has a thickness of 0.4-1.2 nm, the subsequent insulating layer and magnetic layers are comprised of CoFeB and MgO having thickness of 0.2-1.0 nm. In yet another embodiment, the last insulating layer is comprised of MgO having thickness of 0.4 to 1.0 nm.

The other key roles of the magnetic/insulating laminated layer is to enhance spin polarization effect, as well as reduce damping, both intrinsic and dynamic, which results in lower switching current while maintaining high TMR.

While in some embodiments, MgO or alloys of MgO may be employed, the insulating layers may each be made of a material selected from one or more of the oxides or nitrides from aluminum oxide ($Al_2O_3$), titanium oxide ($TiO_2$), tantalum oxide ($Ta_2O_5$), hafnium oxide ($HfO_2$), zirconium oxide ($ZrO_2$), tungsten oxide (WO), niobium oxide ($Nb_2O_5$), chromium oxide ($Cr_2O_3$), silicon oxide ($SiO_2$), yttrium oxide ($Y_2O_3$), vanadium oxide ($VO_2$), ruthenium oxide (RuO), strontium oxide (SrO), zinc oxide (ZnO), magnesium oxide (MgO), titanium nitride (TiN), tantalum nitride (TaN), aluminum nitride (AlN), silicon nitride (SiN).

While the choice of the laminated layer 30 is same as described earlier, the perpendicular magnetic layers 801 and 810 are each comprised of an alloy or multi-layers of cobalt (Co), iron (Fe), nickel (Ni), platinum (Pt) and palladium (Pd). In one embodiment, the layer 810 is comprised of $Co_{(60-70)}Pt_{(30-40)}$ and is deposited from an alloy target or by co-sputtering from Co and Pt targets or mixed alloys of Co—Pt and Pt targets and like. In yet another embodiment, the layers 801 and 810 are comprised of multi-layers of Co and Pt or Pd. In yet another embodiment, the layers 801 and 810 are comprised of $CoFePt_{30}$. In yet another embodiment, the layers 801 and 810 are comprised of FePtCuB alloy. It should be noted that in this case, one needs to heat the substrates to 300° C. to 400° C. prior to the deposition of layers 801 and 810. One advantage of using CoPt, CoPd or CoFePt, or CoFeNiPt alloys or multi-layers of these elements or alloys like Co/Pt, Co/Pd, Co/Pd/Pt/Pd, Co/Ni, CoFe/Pt is that these generally do not require high substrate heating and thus making the processing more simpler.

It should be noted that additional underlayers and seedlayers are generally used underneath the layer 801 to facilitate perpendicular orientation of layer 801 in order to get perpendicular anisotropy.

In the embodiment of FIG. 4, the perpendicular STTM-RAM element 800 comprises a largely perpendicular free layer 40 comprised of laminates of perpendicular magnetic alloy and insulting layers 30 followed by the perpendicular magnetic layer 810. In this case, layers 801, 408, 410, 412 and 810 are all comprised of perpendicular magnetic layers, which are similar to those described hereinabove. Exemplary material making up each of the magnetic layers 801, 408, 410, 412 and 810 is an alloy or multi-layers of cobalt (Co), iron (Fe), nickel (Ni), platinum (Pt) and palladium (Pd). In one embodiment, the layer 810 is comprised of $CO_{(60-70)}Pt_{(30-40)}$ and is deposited from an alloy target or by co-sputtering from Co and Pt targets or mixed alloys of Co—Pt and Pt targets and like. In one embodiment, 801, 408, 410, 412 and 810 layers are comprised of FePtCuB alloy and are deposited following substrate heating to a temperature of about 300° C. In another embodiment, the layers are comprised of L10 alloy of CoPtX where X is one or more from boron (B), copper (Cu), chromium (Cr), tantalum (Ta), tungsten (W), niobium (Nb), silicon (Si), zirconium (Zr), yttrium (Y), gallium (Ga), germanium (Ge), nickel (Ni), molybdenum (Mo), nitrogen (N), carbon (C). In yet another embodiment, the layer 801 is comprised of the L10 alloy FePtCuB, the perpendicular layers of the free layer, namely 408, 410, 412 and 810, are comprised of L10 alloy of CoPt or a multi-layer of one or more of Co (cobalt), Pt (platinum), Pd (palladium) and Ni (nickel).

The layers 406 and 201 are comprised of CoFeB based alloy to enhance spin-polarization effect leading to high TMR ratio as well as lower switching current.

As mentioned earlier, the barrier layer 204 and the insulating layers 407, 409, 411 and 413 can be same oxide or nitride or different and can be chosen from magnesium oxide (MgO), aluminum oxide ($Al_2O_3$), titanium oxide ($TiO_2$), tantalum oxide ($Ta_2O_5$), hafnium oxide ($HfO_2$), zirconium oxide ($ZrO_2$), tungsten oxide (WO), niobium oxide ($Nb_2O_5$), chromium oxide ($Cr_2O_3$), silicon oxide ($SiO_2$), yttrium oxide ($Y_2O_3$), vanadium oxide ($VO_2$), ruthenium oxide (RuO), strontium oxide (SrO), zinc oxide (ZnO), magnesium oxide (MgO), titanium nitride (TiN), tantalum nitride (TaN), aluminum nitride (AlN), silicon nitride (SiN). In a preferred mode, the barrier layer 204 and the insulating layers 407, 409, 411 and 413 are made of MgO.

Typical thickness of different layers are also similar as described earlier, such as, the perpendicular magnetic layers 801, 408, 410, 412 and 810 can be between 0.2 and 10 nm. In a preferred mode, the perpendicular magnetic layer 801 is 3 to 10 nm while the perpendicular magnetic layer of the composite laminated free layer, namely layers 408, 410, 412 and 810 are 0.2-2 nm. In a preferred mode, the typical thickness of the insulating layers 407, 409, 411 and 413 is 0.1 nm-2 nm.

Figure 5:
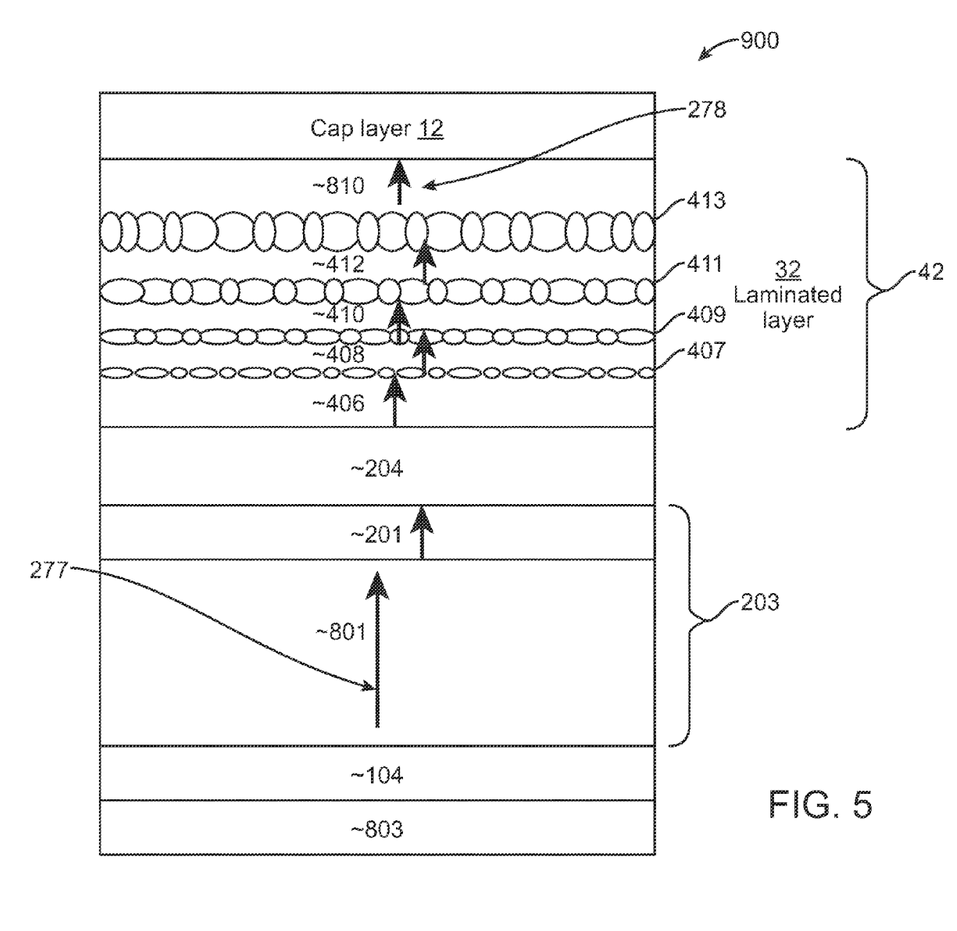
FIG. 5 shows an STTMRAM element 800, in accordance with another embodiment of the present invention.

The STTMRAM element 800 is further comprised of fixed layer 801 is shown formed on top of the underlayer 104, which is shown formed on top of the seedlayer 803. The seedlayer 803 of the embodiments of FIGS. 4 and 5 are each typically formed on a substrate. In the embodiments of FIGS. 1 and 3, the underlayer 106 is shown formed on a substrate.

In some embodiments the laminated layers 30 and 32 in FIGS. 4 and 5 can be placed below the fixed layer 801 to enhance better crystal orientation for the layer 801 and thereby leading to higher perpendicular anisotropy for the fixed layer 801. If an underlayer or a seedlayer is to be chosen from one having chromium based alloy, then in that case having the laminated layer 32 placed underneath the fixed layer 203 also deters the diffusion of certain elements such as Cr from the underlayer or seed layer into the barrier layer. This would have a negative impact on the TMR of the finished MTJ, leading to a lower TMR value. In such a case, an amorphous magnetic alloy, such as CoFeB based alloy, for the laminates may be preferred as this would deter the diffusion of unwanted elements to the barrier layer. In another embodiment, the underlayer is made of a Cr (chromium) alloy and 3 to 5 laminates of CoFeB and MgO are deposited before depositing the perpendicular magnetic layer 810 followed by the magnetic layer 201 of largely CoFeB alloy. Such perpendicular MTJ has generally higher TMR of over 100% at a low RA of about 10 ohm-um$^2$.

Figure 6:
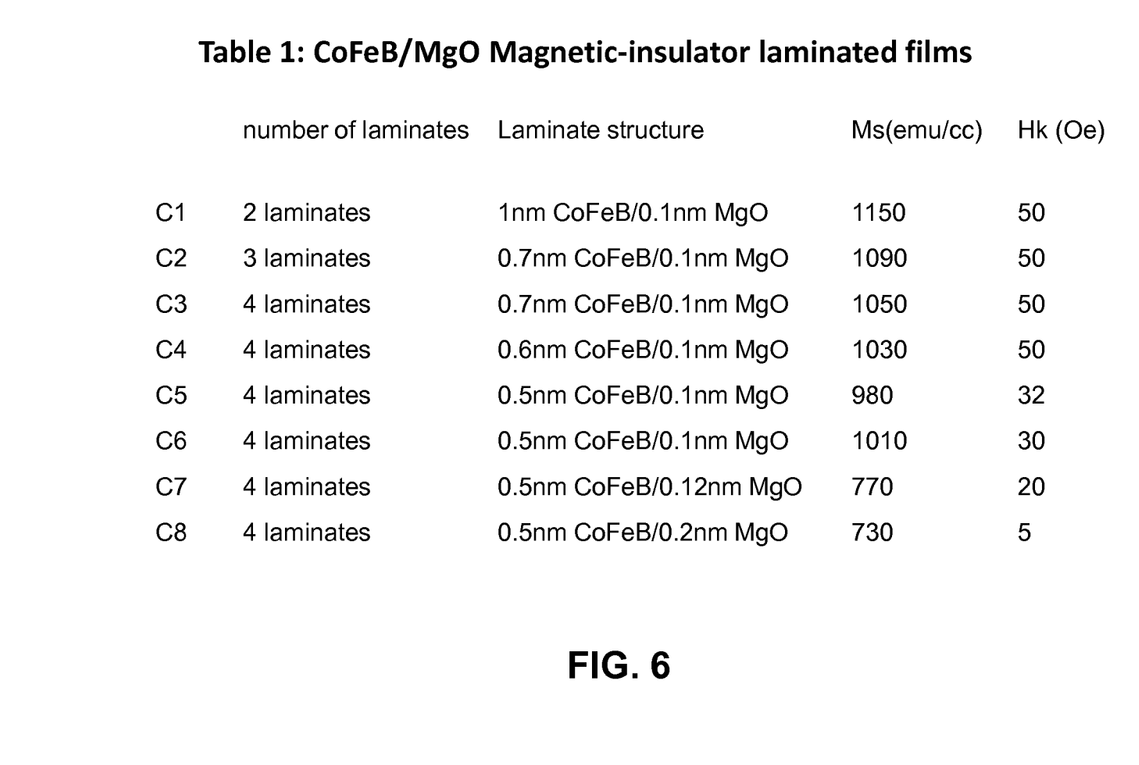
FIG. 6 shows the magnetic properties of laminates of different thicknesses of $CoFe_{20}B_{20}$ and MgO multilayer as listed in Table 1.

FIG. 6 shows the magnetic properties of laminates of different thicknesses of CoFe$_{20}$B$_{20}$ and MgO multilayer as listed in Table 1. As can be seen, by changing the magnetic layer thickness and the insulating layer thickness of a laminated free layer of the various embodiments of the present invention, the overall Ms of the laminated layers can be changed from 1150 emu/cc down to 730 emu/cc and Hk from about 50 Oe down to below 5 Oe. For the samples C2 and C3 having 3 and 4 laminates, the Ms and Hk are essentially similar. For samples C6, C7 and C8, the insulator layer thickness was changed from 0.1 nm to 0.2 nm while keeping the magnetic layer thickness to 0.5 nm, and this results in a drop in Ms from 1010 emu/cc to 730 emu/cc, by about 30 percent. Additionally, Hk drops from 30 Oe down to 5 Oe.

Figure 7:
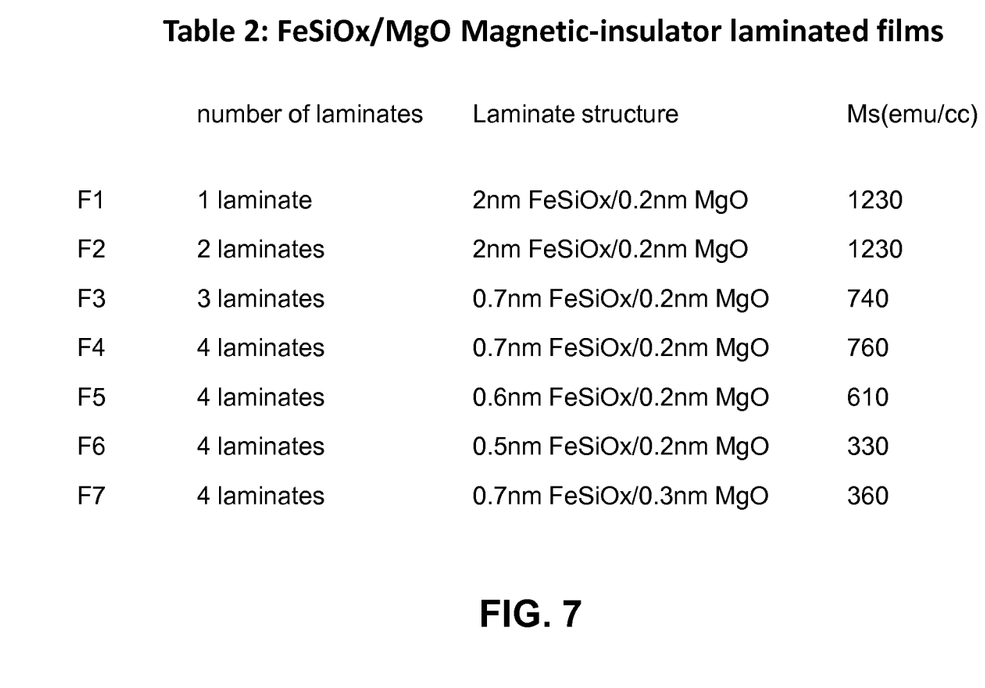
FIG. 7 shows magnetic properties as listed in Table 2 for one embodiment of laminates of a composite laminated free layer 15 where the second laminate (from the bottom) and up are comprised of the magnetic layer FeSiOx and insulating layer MgO.

As pointed out earlier that while it is important to keep the magnetic layer 206 of the composite laminated free-layer to be primarily comprised of CoFeB in order to get higher TMR and lower RA for the STTMRAM element, the other magnetic layers such as layer 208, 210 away from the barrier layer 204 can be of different composition. FIG. 7 shows magnetic properties as listed in Table 2 for one embodiment of laminates of a composite laminated free layer where the second laminate (from the bottom) and up are comprised of the magnetic layer FeSiOx and insulating layer MgO. As can be seen in Table 2, for samples F1 and F2 having one and two laminate, respectively, of 2 nm FeSiOx and 0.2 nm MgO, the saturation magnetizations, Ms, are essentially same at 1230 emu/cc. Samples F3 and F4 show that for 0.7 nm thick FeSiOx and 0.2 nm MgO, the Ms dropped to about 750 emu/cc. Sample F5 shows that for 4 laminates, when the FeSiOx layer thickness is dropped to 0.5 nm while keeping the MgO layer thickness to 0.2 nm, the Ms further drops to 610 emu/cc, leading to almost 50% drop from sample F1. Samples F6 and F7 show laminates where the FeSiOx and MgO layer were separately changed to get almost same Ms of 330 emu/cc and 360 emu/cc, respectively.

It should be pointed out that, during manufacturing, the various layers of the composite laminated free layers of the various embodiments of the present invention can be deposited in a static deposition system or a dynamic deposition system. In addition, the laminates can be deposited by co-sputtering from two or more targets either by depositing simultaneously or following a predetermined delay. Co-sputtering is well known to those skilled in the relevant art. A specific example of a manufacturing step is depositing the films shown in Tables 1, 2 and 3 (FIG. 8) in the Timaris sputtering system made by Singulus NDT of Germany.

Figure 8:
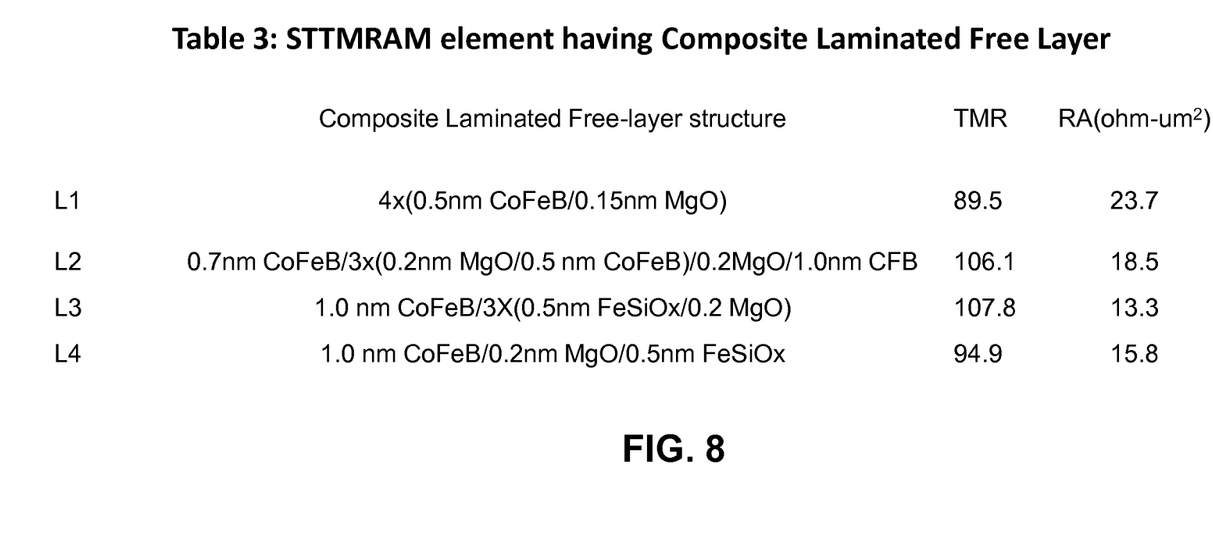
FIG. 8 shows the magnetic properties of STTMRAM element having composite laminated free layer as listed in Table 3.

FIG. 8 shows the magnetic properties of STTMRAM element having composite laminated free layer as listed in Table 3. As can be seen in Table 3 sample L1 is STTMRAM element 200 having 4 laminates of 0.5 nm thick magnetic layer of CoFeB and the insulating layer of MgO having thickness of 0.15 nm. The TMR of this film after annealing at 300° C. for 2 hours under a field of 2 Tesla is 89.5% and the RA of 23.7 ohm-um$^2$. The sample L2 has a magnetic layer 206 having 0.7 nm, followed by three laminates of insulating layer MgO and the magnetic CoFeB having thickness of 0.2 nm and 0.5 nm respectively, followed by a last laminate of 0.2 nm of MgO and 1.0 nm of CoFeB. The TMR of this STTMRAM element was 106.1% and a RA of 18.5 ohm-um$^2$. L3 and L4 show STTMRAM having dissimilar magnetic materials for the higher up stack than the magnetic layer 206 immediately adjacent to the barrier layer 204. Once again a high TMR and low RA values are observed.

During a write operation, a bidirectional electric current is applied across the STTMRAM element 200, 400, 600, 800. The electric current becomes spin polarized by transmission through or by reflection from the fixed layer 202. The spin polarized current exerts a spin torque on the magnetic moment of the magnetic layers of the composite laminated free layer 206, 208 and 210 when it passes through it. The spin torque causes the magnetic moment of the composite laminated free layer to switch from one state to another when the electric current density is sufficiently high. The magnetic moment of the composite laminated free layer of the STTMRAM element 200, 400, 600, 800 can be switched to be parallel or anti-parallel to the magnetization direction of the fixed layer 202, depending on the electric current follow direction. For example, in the embodiment of FIG. 2, when electric current flows from the top of the composite laminated free-layer or from the top of the top magnetic layer 412 down to the fixed layer 202 and then into the underlying metal layer, the magnetization direction of the free layer is parallel relative to the fixed layer, and if electric current flows from the metal layer (not shown here) underneath the fixed layer 202 to the cap layer (not shown here) residing on top of the composite laminated free-layer, the magnetization direction of the free layer is anti-parallel relative to the fixed layer. The parallel magnetization configuration corresponds to a low resistance ($R_l$) state (the logical "0") of MTJ. The anti-parallel magnetization configuration corresponds to a high resistance ($R_h$) state (the logical "1") of MTJ. Thus, during a write operation, a bidirectional electric current is applied across the STTMRAM element to switch the magnetization of the free layer between parallel and anti-parallel states relative to the magnetization of the composite fixed layer.

During manufacturing, the deposition of the magnetic tunnel junction and the composite laminated layers can be deposited by sequential sputtering through an in-line machine or a static sputtering or PVD machine. The alternate layers can also be deposited through multiple targets by alternating sputtering each layers or by co-sputtering from two and more targets. It is likely that these targets can be switched on alternatingly or with a time delay. Additionally, these can also be deposited from one or more composite targets having magnetic and the insulating layer alternatingly placed as the substrate is passed in front of the target. In such a case, perhaps the target should be a rf-sputtering cathode. It is likely that the insulating layer can also be formed partly or mostly by using reactive PVD or sputtering process, where oxidizing gases, such as oxide and nitride forming gases, are introduced to form insulator of oxides or nitrides.

In the various embodiments of the present invention, the underlayer may be or may include as one of its layers as underlayers, metals layers, and likewise having on the top having cap layers and metal layers.

The STTMRAM elements of the various embodiments of the present invention are submicron-sized or nano-scaled.

The structures including layers of the various drawings included herein are not drawn to scale.

It should be noted that while reference is made only to the STTMRAM element, in the actual STTMRAM memory these elements are arranged in arrays while the individual STTMRAM elements are connected in-series with an access transistor in a typical 1 T-1 MTJ (one transistor-one MTJ) design. The STTMRAM element and the access transistor are referred to as the STTMRAM memory cell. The transistors are connected to the bit-lines and word-lines in a cross-line array and are connected to other select transistors, sense amps and reference-cell circuits. A group of the STTMRAM memory elements are addressed in the array through decoders such as row and column decoders, which are connected to the various latches and other logic functions to meet the timing and other requirements. Such an STTMRAM memory can be used for a number of applications as stand-alone memory such as for hand-held consumer devices, laptops, set-top-boxes etc. as well as for embedded application such as SOC or microprocessors.

Although the present invention has been described in terms of specific embodiments, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin-transfer torque magnetic random access memory (STTMRAM) element comprising:
   a magnetic fixed layer having an invariable magnetization direction perpendicular to layer plane thereof;
   a barrier layer formed adjacent to said magnetic fixed layer; and
   a magnetic free layer formed adjacent to said barrier layer opposite said magnetic fixed layer, said magnetic free layer having a variable magnetization direction perpendicular to layer plane thereof and including a first plurality of magnetic sublayers interleaved with a second plurality of insulating sublayers.

2. The STTMRAM element of claim 1, wherein said magnetic fixed layer comprises two magnetic sublayers having said invariable magnetization direction.

3. The STTMRAM element of claim 2, wherein at least one of said two magnetic sublayers of said magnetic fixed layer comprises cobalt, iron, and boron.

4. The STTMRAM element of claim 2, wherein at least one of said two magnetic sublayers of said magnetic fixed layer comprises iron and platinum.

5. The STTMRAM element of claim 2, wherein each of said two magnetic sublayers of said magnetic fixed layer comprises cobalt and iron.

6. The STTMRAM element of claim 2, wherein at least one of said two magnetic sublayers of said magnetic fixed layer has a multilayer structure formed by interleaving layers of a first material with layers of a second material with at least one of said first and second materials being magnetic.

7. The STTMRAM element of claim 6, wherein said multilayer structure is made of [Co/Pt], [Co/Pd], [Co/Ni], [CoFe/Pt], or any combination thereof.

8. The STTMRAM element of claim 1, wherein at least one of said first plurality of magnetic sublayers comprises cobalt, iron, and boron.

9. The STTMRAM element of claim 1, wherein each of said first plurality of magnetic sublayers comprises cobalt and iron.

10. The STTMRAM element of claim 1, wherein each of said second plurality of insulating sublayers is made of an oxide.

11. The STTMRAM element of claim 1, wherein each of said second plurality of insulating sublayers comprises magnesium and oxygen.

12. The STTMRAM element of claim 11, wherein each of said first plurality of magnetic sublayers comprises cobalt, iron, and boron.

13. The STTMRAM element of claim 1, wherein at least one of said second plurality of insulating sublayers comprises magnesium and oxygen.

14. The STTMRAM element of claim 1, further comprising a non-magnetic seed or cap layer formed adjacent to said magnetic free layer.

15. The STTMRAM element of claim 1, wherein said first plurality of magnetic sublayers are ferromagnetically coupled.

* * * * *